(12) United States Patent
Kikuchi et al.

(10) Patent No.: US 9,666,464 B2
(45) Date of Patent: May 30, 2017

(54) SUBSTRATE PROCESSING APPARATUS AND SUBSTRATE PROCESSING METHOD

(71) Applicant: Tokyo Electron Limited, Tokyo (JP)

(72) Inventors: Hiroshi Kikuchi, Iwate (JP); Naoto Saito, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 85 days.

(21) Appl. No.: 14/626,241

(22) Filed: Feb. 19, 2015

(65) Prior Publication Data

US 2015/0243540 A1  Aug. 27, 2015

(30) Foreign Application Priority Data

Feb. 24, 2014  (JP) ................................ 2014-033015

(51) Int. Cl.
*H01L 21/677* (2006.01)
*H01L 21/673* (2006.01)

(52) U.S. Cl.
CPC .. *H01L 21/67775* (2013.01); *H01L 21/67379* (2013.01); *H01L 21/67772* (2013.01)

(58) Field of Classification Search
CPC ......... H01L 21/67775; H01L 21/67379; H01L 21/67376; H01L 21/67373; H01L 21/67772; H01L 21/67126
See application file for complete search history.

(56) References Cited

U.S. PATENT DOCUMENTS

| | | | | |
|---|---|---|---|---|
| 5,451,131 A | * | 9/1995 | Hecht | H01L 21/67126 118/50 |
| 6,393,716 B1 | * | 5/2002 | Chang | H01L 21/67775 34/402 |
| 2007/0199860 A1 | * | 8/2007 | Asari | F27B 5/04 206/710 |
| 2009/0143876 A1 | * | 6/2009 | Sugawara | G05B 9/02 700/79 |
| 2010/0059408 A1 | * | 3/2010 | Igarashi | H01L 21/67772 206/710 |
| 2010/0133270 A1 | * | 6/2010 | Okabe | H01L 21/67772 220/212 |

FOREIGN PATENT DOCUMENTS

JP  WO 03088351 A1 * 10/2003 ....... H01L 21/67775
JP  2008-060513 A  3/2008

* cited by examiner

*Primary Examiner* — Glenn Myers
(74) *Attorney, Agent, or Firm* — Abelman, Frayne & Schwab

(57) ABSTRACT

Provided is a substrate processing apparatus including: a carry-in area where a placing table is provided to place thereon a carrying container including a take-out opening, a flange formed on an upper portion of a side formed with the take-out opening, and a recess formed on a top surface of the flange; a transfer area maintained under an atmosphere different from that of the carry-in area; a partition wall configured to partition the carry-in area and the transfer area and formed with an opening; a door configured to open/close the opening; a carrying container pressing unit configured to press the carrying container placed on the placing table against the partition wall so that the take-out opening of the carrying container faces the opening of the partition wall; and a carrying container holding unit configured to be inserted into the recess to press the carrying container against the partition wall.

8 Claims, 6 Drawing Sheets

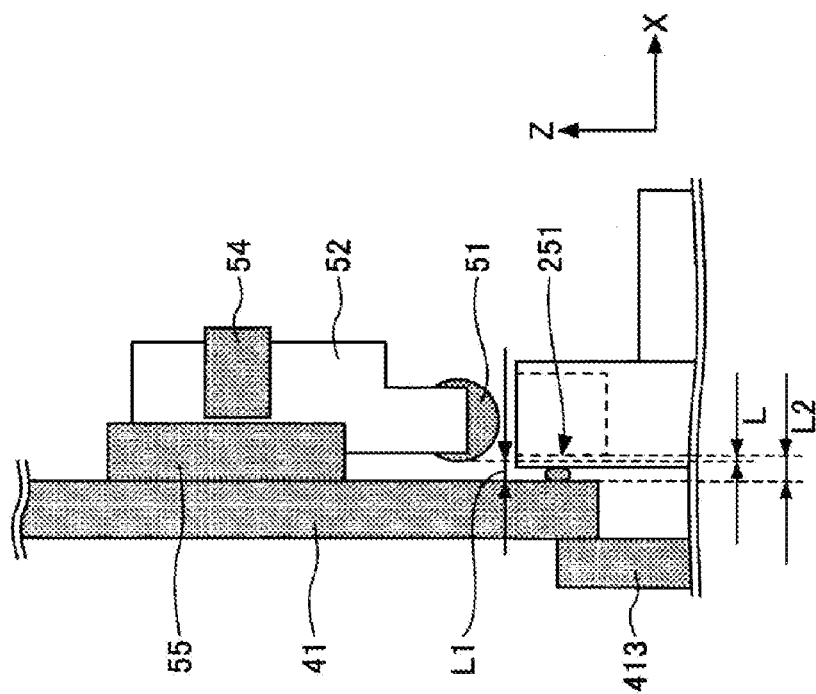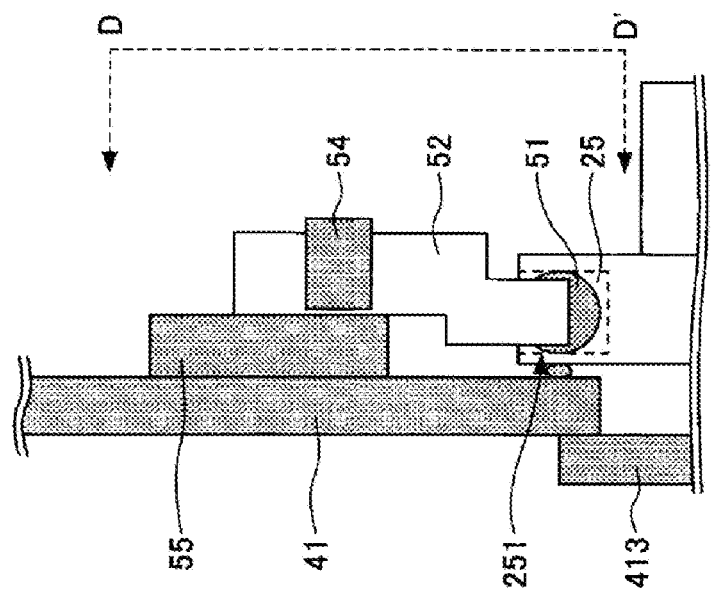
FIG.5A
FIG.5B

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2014-033015, filed on Feb. 24, 2014, with the Japan Patent Office, the disclosure of which is incorporated herein in its entirety by reference.

TECHNICAL FIELD

The present disclosure relates to a substrate processing apparatus and a substrate processing method.

BACKGROUND

In manufacturing a semiconductor device, various substrate processing apparatuses (semiconductor apparatuses) are used in order to perform processes such as, for example, oxidation, diffusion, chemical vapor deposition (CVD), and annealing on a processing target object, for example, a substrate such as, for example, a semiconductor wafer (hereinafter, also simply referred to as a "wafer"). Further, as one of the substrate processing apparatuses, a batch type substrate processing apparatus (a substrate heat treatment apparatus) has been known in which a heat treatment may be performed on a plurality of wafers at one time.

Here, an exemplary configuration of a batch type substrate processing apparatus of the related art will be described with reference to FIG. 1.

FIG. 1 a cross-sectional view schematically illustrating the periphery of a partition wall provided between a transfer area and a carry-in area in a substrate processing apparatus.

In FIG. 1, a carry-in area 12 is illustrated on the right of a partition wall 11 in the drawing. Wafers are carried into the carry-in area 12 from the outside of the apparatus by a carrying container (also referred to as a "carrier" or "FOUP") 14 in which a plurality of wafers is accommodated. The carry-in area 12 is under the same atmosphere as the periphery where the substrate processing apparatus is provided, for example, under an ambient atmosphere.

A transfer area 13 is illustrated on the left of the partition wall 11 in the drawing. In the transfer area 13, the wafers in the carrying container 14 are transferred to a boat (a holder) configured to hold wafers to be supplied to a heat treatment furnace and wafers, which have subjected to a heat treatment, are transferred from the boat to the carrying container 14. In the transfer area 13, an inert gas atmosphere or a clean dry air atmosphere is formed in order to prevent the wafers from being contaminated and to prevent a natural oxide film from being produced on the wafers in some cases. Further, in order to prevent the atmosphere of the carry-in area 12 from infiltrating into the transfer area 13, the pressure in the transfer area 13 is set to be higher than the pressure in the carry-in area 12.

Meanwhile, an opening 111 is formed through the partition wall 11 and an opening/closing door 112 is provided in the opening 111.

In the carry-in area 12, the carrying container 14, in which the wafers to be supplied to the transfer area 13 are accommodated, is placed on a placing table 15. In the carrying container 14, a take-out opening (not illustrated) is provided on a side surface 141 (left surface in the drawing) in order to take out the wafers in the carrying container 14 and a sealable cover (not illustrated) is provided on the take-out opening in order to prevent the wafers in the carrying container 14 from being contaminated by particles. When the carrying container 14 is placed on the placing table 15, the carrying container 14 is placed such that the take-out opening faces the opening 111 of the partition wall 11.

The carrying container 14 placed on the placing table 15 is pressed against the partition wall 11 by a carrying container pressing unit (not illustrated) provided on the placing table 15. When the carrying container 14 is pressed against the partition wall 11, the surface of the carrying container 14 which faces the partition wall 11 abuts against the partition wall 11 with a sealing member (not illustrated) being interposed therebetween. The sealing member is provided to surround the opening 111 of the partition wall 11.

The carrying container 14 pressed against the partition wall 11 is pushed downwardly by a pushing unit 16 provided above the carrying container 14. In this case, a front end of the pushing unit 16 is accommodated in a recess (not illustrated) formed on a handle 142 on the top of the carrying container 14 so as to restrain the movement of the carrying container 14 in the X-axis direction in the drawing.

Subsequently, the cover of the carrying container 14 is opened by a cover opening mechanism (not illustrated) and the door 112 is opened by a door opening mechanism (not illustrated). In this case, since the carrying container 14 is pressed against the partition wall 11, the atmosphere in the carry-in area 12 may be prevented from infiltrating into the transfer area 13. According to the above-described operation, since the inner space of the carrying container 14 and the transfer area 13 are directly connected with each other, the wafers in the carrying container 14 may be carried into the transfer area 13 by a transfer unit (not illustrated) which is provided at the transfer area 13 side.

SUMMARY

The present disclosure was made in an effort to solve problems in the related art, and provides a substrate processing apparatus. The substrate processing apparatus includes: a carry-in area where a placing table is provided to place thereon a carrying container configured to accommodate a plurality of processing target objects, in which the carrying container includes a take-out opening configured to load/unload the processing target objects therethrough, a flange formed on an upper portion of a side of a surface formed with the take-out opening, and a recess formed on a top surface of the flange; a transfer area maintained under an atmosphere different from that of the carry-in area; a partition wall configured to partition the carry-in area and the transfer area and formed with an opening; a door configured to open/close the opening; a carrying container pressing unit configured to press the carrying container placed on the placing table against the partition wall so that the take-out opening of the carrying container faces the opening of the partition wall; and a carrying container holding unit configured to be inserted into the recess from an upper side of the carrying container to press the carrying container against the partition wall.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 5A and 5B are schematic explanatory views of a carrying container holding unit according to an exemplary embodiment of the present disclosure, in which a part enclosed by dotted line C in FIG. 4 is illustrated in an enlarged scale.

DETAILED DESCRIPTION

In the following detailed description, reference is made to the accompanying drawing, which form a part hereof. The illustrative exemplary embodiments described in the detailed description, drawing, and claims are not meant to be limiting. Other exemplary embodiments may be utilized, and other changes may be made without departing from the spirit or scope of the subject matter presented here.

Figure 1:
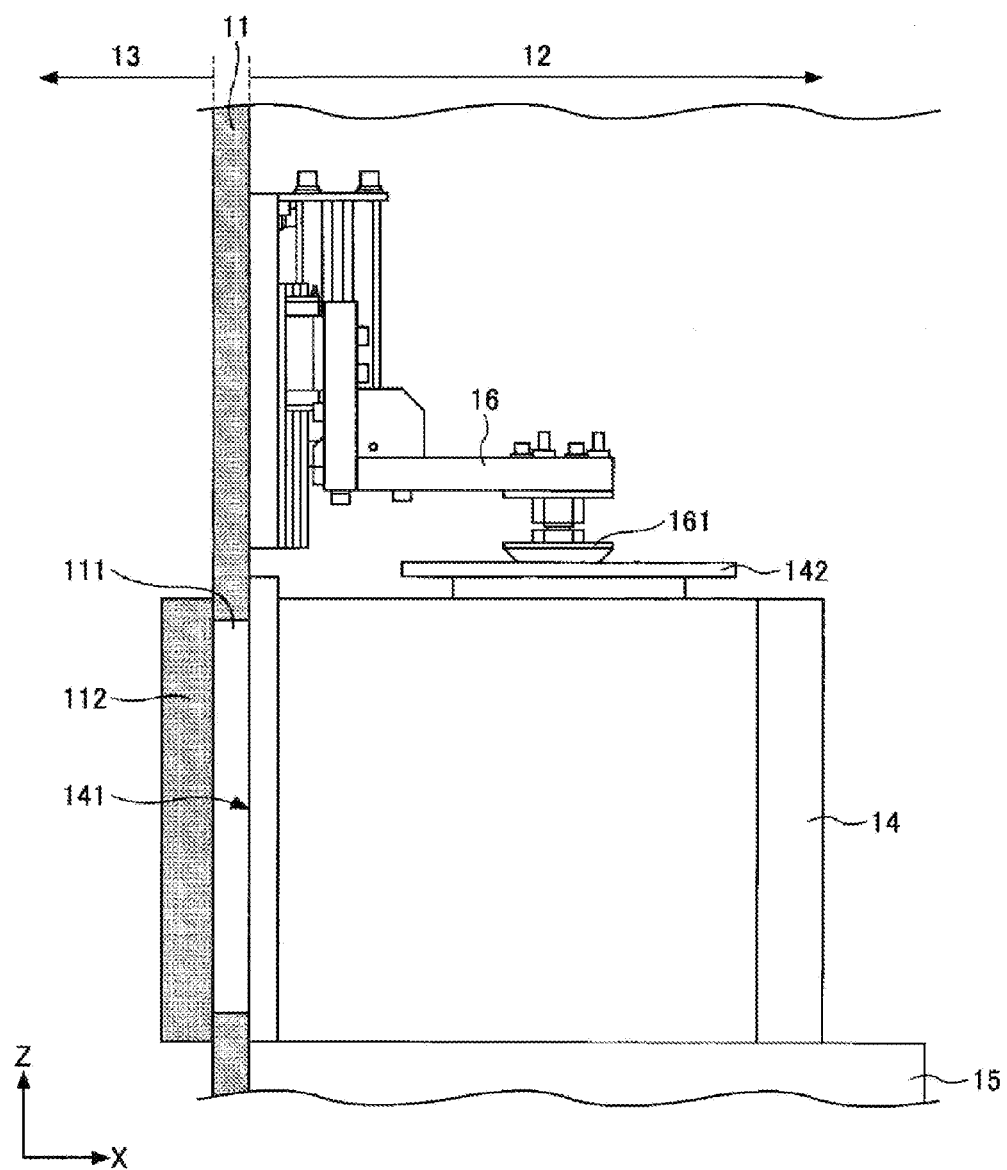
FIG. 1 is an explanatory view illustrating a substrate processing apparatus of the related art.

According to the substrate processing apparatus illustrated in FIG. 1, since the carrying container 14 is downwardly pushed from the top side of the carrying container 14 by the pushing unit 16, the carrying container 14 may be deformed so that a gap may occur between the carrying container 14 and the partition wall 11. Therefore, when the door 112 is opened, the atmosphere of the carry-in area 12 may infiltrate into the transfer area 13 and as a result, the atmosphere of the transfer area 13 may be contaminated in some cases.

Since the pressure of the transfer area 13 is set to be higher than that of the carry-in area 12, when the door 112 is opened, a force is applied to the carrying container 14 in the X-axis direction in the drawing.

Therefore, as described above, the top surface of the carrying container 14 is pushed downwardly (in the minus Z-axis direction in the drawing) along the Z-axis by the pushing unit 16 and the front end 161 of the pushing unit 16 and the recess formed on the handle 142 are engaged with each other so as to restrain the movement in the X-axis direction. However, since an angle of about 90 degrees is formed between the direction of the force applied to the carrying container 14 by pressure of the transfer area 13 and the direction of the force applied to the carrying container 14, it is difficult to reliably suppress the movement of the top surface of the carrying container 14 in the X-axis direction.

As described above, in the substrate processing apparatus of the related art, when the processing target objects are loaded/unloaded between the transfer area 13 and the carrying container, a gap may occur between the partition wall 11 and the carrying container 14 in some cases. Therefore, when the door 112 is opened, the atmosphere of the carry-in area 12 may infiltrate into the transfer area 13 and as a result, the atmosphere of the transfer area 13 may be contaminated.

The present disclosure was made in an effort to provide a substrate processing apparatus which is capable of suppressing occurrence of a gap between a partition wall provided between a carry-in area and a transfer area and a carrying container placed on a placing table in the carry-in area when processing target objects are loaded or unloaded between the transfer area and the carrying container mounted on the placing table in the carry-in area.

According to an aspect of the present disclosure, a substrate processing apparatus includes: a carry-in area where a placing table is provided to place thereon a carrying container configured to accommodate a plurality of processing target objects, in which the carrying container includes a take-out opening configured to load/unload the processing target objects therethrough, a flange formed on an upper portion of a side of a surface formed with the take-out opening, and a recess formed on a top surface of the flange; a transfer area maintained under an atmosphere different from that of the carry-in area; a partition wall configured to partition the carry-in area and the transfer area and formed with an opening; a door configured to open/close the opening; a carrying container pressing unit configured to press the carrying container placed on the placing table against the partition wall so that the take-out opening of the carrying container faces the opening of the partition wall; and a carrying container holding unit configured to be inserted into the recess from an upper side of the carrying container to press the carrying container against the partition wall.

In the substrate processing apparatus described above, the carrying container holding unit may include a roller unit, and a plate-shaped body connected to the roller unit, and the plate-shaped body includes an elastic body.

In the substrate processing apparatus described above, the carrying container holding unit may include a roller unit, and a plate-shaped body connected to the roller unit, and the roller unit includes an elastic body.

In the substrate processing apparatus, when the carrying container holding unit is inserted into the recess, the carrying container holding unit may be inserted obliquely with respect to a wall of the recess closest to the partition wall among walls of the recess.

In the substrate processing apparatus, a magnitude of a force applied by the carrying container holding unit to press the carrying container against the partition wall may be equal to or smaller than a magnitude of a force applied by the carrying container pressing unit to press the carrying container against the partition wall.

According to another aspect of the present disclosure, there is provided a substrate processing method using a substrate processing apparatus. The substrate processing apparatus includes: a carry-in area where a placing table is provided to place thereon a carrying container configured to accommodate a plurality of processing target objects, in which the carrying container includes a take-out opening to configured to load/unload the processing target objects therethrough, a flange formed on an upper portion of a side of a surface formed with the take-out opening, and a recess formed on a top surface of the flange; a transfer area maintained under an atmosphere different from that of the carry-in area; a partition wall configured to partition the carry-in area and the transfer area and formed with an opening; and a door configured to open/close the opening. The carrying container placed on the placing table is pressed against the partition wall so that the take-out opening of the carrying container faces the opening of the partition wall, and the door is opened to convey the processing target objects within the carrying container to the transfer area and to process the processing target objects. When the carrying container is pressed against the partition wall, the carrying container holding unit is inserted into the recess from an upper side of the carrying container to press the carrying container against the partition wall.

The present disclosure may provide a substrate processing apparatus which is capable of suppressing occurrence of a gap between a partition wall provided between a carry-in area and a transfer area and a carrying container mounted on a placing table in the carry-in area when a processing target object is loaded/unloaded between the transfer area and the carrying container mounted on the placing table in the carry-in area.

Hereinafter, exemplary embodiments of the present disclosure will be described with reference to the drawings but the present disclosure is not limited to the exemplary embodiments. Various modifications and substitutions may be made to the following exemplary embodiment without departing from the scope of the present disclosure.

(Substrate Processing Apparatus)

In the present exemplary embodiment, an exemplary configuration of a substrate processing apparatus will be described. Even though a vertical heat treatment apparatus is described as an example of the substrate processing apparatus in the present exemplary embodiment, the present disclosure is not limited to the present exemplary embodiment.

The vertical heat treatment apparatus of the present exemplary embodiment may include a carry-in area and a transfer area.

In the carry-in area, a placing table, on which a carrying container is placed, may be provided. The carrying container is capable of accommodating a plurality of processing target objects. The carrying container may include a take-out opening to load/unload the processing target objects, a flange formed in an upper portion of a side of a surface formed with the take-out opening, and a recess formed on a top surface of the flange.

The transfer area may be maintained under an atmosphere which is different from that of the carry-in area.

A partition wall configured to partition the carry-in area and the transfer area and provided with an opening, and a door configured to open/close the opening of the partition wall may be provided.

The vertical heat treatment apparatus may include a carrying container pressing unit configured to press the carrying container placed on the placing table against the partition wall in a state where the take-out opening and the opening of the partition wall face each other. Further, a carrying container holding unit configured to be inserted into the recess from the upper side of the carrying container so as to press the carrying container against the partition wall may be provided.

Here, an exemplary configuration of a carrying container for use in conveying and storing processing target objects in a vertical heat treatment apparatus of the present exemplary embodiment will be first described with reference to FIGS. 2A and 2B.

Figure 2A:
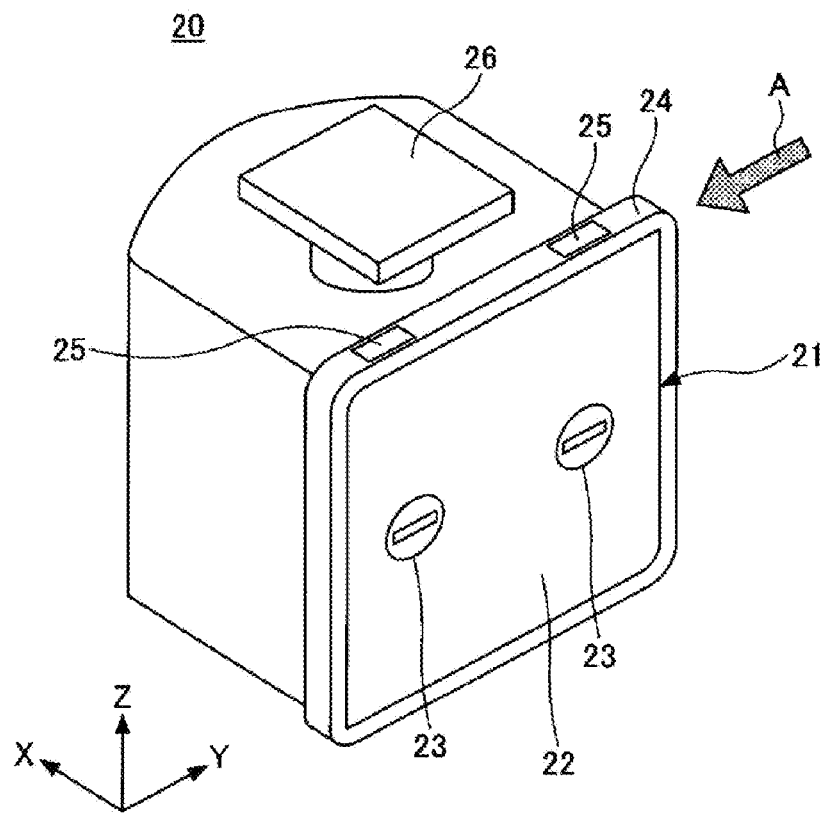
FIGS. 2A and 2B are explanatory views illustrating a carrying container.

FIG. 2A is a schematic perspective view illustrating an exemplary carrying container of a processing target object. In addition, FIG. 2B is a side view illustrating the carrying container which is viewed in the direction indicated by block arrow A in FIG. 2A, that is, viewed in a minus Y axis direction in the drawing. Meanwhile, although the present exemplary embodiment is described with reference to a sealed front opening unified pod (FOUP) as the carrying container that accommodates processing target objects, the present disclosure is not limited thereto.

As illustrated in FIG. 2A, a carrying container 20 has a take-out opening 21 formed on one end side to load/unload a processing target object thereof, and the other end side of the carrying container 20 may be formed to have substantially a semi-elliptical shape, for example.

A cover 22 corresponding to the take-out opening 21 is detachably attached to the take-out opening 21 of the carrying container 20 and the inside of the carrying container 20 is maintained substantially in an air-tight state by the cover 22. In general, the atmosphere in the carrying container 20 is clean air.

The cover 22 is provided with two cover lock mechanisms 23 and configured to be attached to/detached from the take-out opening 21 by locking or unlocking the cover lock mechanisms 23.

Although not illustrated in FIG. 2A which illustrates the carrying container 20 in a state where the cover 22 is attached to the take-out opening 21, the carrying container 20 may accommodate wafers as processing target objects therein.

A supporting unit is formed on an inner wall of the carrying container 20 to place the wafers as the processing target objects in multiple tiers thereon. By placing peripheries of the wafers on the supporting unit to be supported, the wafers are accommodated in multiple tiers with approximately the same pitch. Therefore, a plurality of wafers may be accommodated in the carrying container 20. For example, 25 wafers may be accommodated in one carrying container 20. The diameter of wafers to be used is not specifically limited but wafers having a diameter of 300 mm or wafers having a diameter of 450 mm may be appropriately used. In particular, in the case where the 450 mm wafers are used, the size of the carrying container 20 should be increased in accordance with the wafers, and thus, a gap may easily occur between the carrying container and a partition wall. In the vertical heat treatment apparatus of the present exemplary embodiment, the occurrence of the gap between the partition wall and the carrying container 20 may be suppressed. For this reason, in the vertical heat treatment apparatus of the exemplary embodiment, the 450 mm wafers may be more preferably used as processing target objects.

Figure 2B:
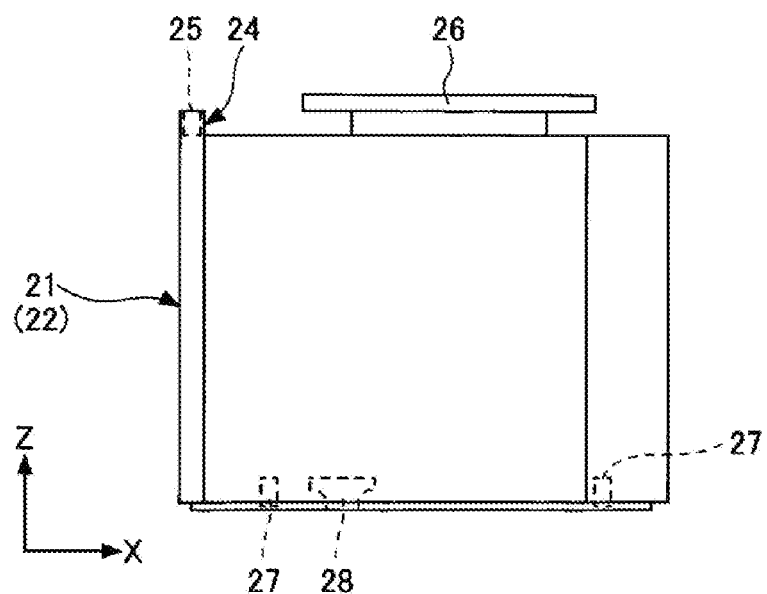

As illustrated in FIGS. 2A and 2B, in the carrying container 20, a flange 24 is formed on the upper portion of the side where the take-out opening 21 is provided. Meanwhile, the flange 24 may be formed not only on the top of the carrying container 20, but also along a peripheral surface including the lateral surfaces and bottom surface of the side where the take-out opening 21 is formed so as to enclose the take-out opening 21, as illustrated in FIGS. 2A and 2B.

A recess 25 is formed on the top surface of the flange 24. For example, recesses 25 may be formed at two locations on the top surface of the flange 24 to be spaced apart from each other, as illustrated in FIG. 2A.

The recesses 25 are not limited to those formed at two locations on the top surface of the flange 24 as illustrated in FIG. 2A. The recesses 25 may be formed at three or more locations. Further, for example, one recess may be formed on the top surface of the flange 24 to be continuous along the entire width direction of the carrying container 20, that is, along the Y-axis direction in the drawing.

The shape of the recess 25 is not especially limited. However, for example, as illustrated by a dotted line in FIG. 2B, the cross-sectional shape of the recess 25 in the cross-section which passes through the recess 25 to be perpendicular to the take-out opening 21, that is, the cross-sectional shape of the recess 25 on an XZ plane in the drawing may be a quadrangular shape. Meanwhile, when two or more recesses 25 are formed as described above, the shapes of the recesses 25 may be the same.

A handle 26 may be formed on a ceiling of the carrying container 20 to be capable of being grasped when holding the carrying container 20.

As illustrated in FIG. 2B, a plurality of positioning recesses 27 may be formed on a bottom surface of the bottom portion of the carrying container 20. By forming the positioning recesses 27, the positioning of the carrying container 20 may be performed by pins provided on a placing table or a placing shelf and the positioning recesses 27 formed on the carrying container 20 when the carrying container 20 is conveyed in the vertical heat treatment apparatus and placed on the placing table or the placing shelf. Meanwhile, since the positioning recesses 27 are formed on the bottom part of the carrying container 20 and are not visible from a lateral side, the positioning recesses 27 are illustrated by dotted lines in FIG. 2B. Although FIG. 2B illustrates an example in which the positioning recesses 27 are formed at two locations, the positioning recesses 27 may be formed at three locations, for example.

As illustrated in FIG. 2B, an engagement recess 28 may be formed on the bottom part of the carrying container 20. A locking mechanism corresponding to the shape of the engagement recess 28 of the carrying container 20 is provided on the placing table in the carry-in area so as to fix the carrying container 20 when the carrying container 20 is placed on the placing table. Since the engagement recess 28 is also formed on the bottom part of the carrying container 20 and is not visible from the side, the engagement recess 28 is illustrated by a dotted line in FIG. 2B. In FIG. 2B, although one engagement recess 28 is formed, for example, two or more engagement recesses 28 may be formed.

Next, an exemplary configuration of a vertical heat treatment apparatus according to an exemplary embodiment will be described with reference to FIG. 3.

Figure 3:
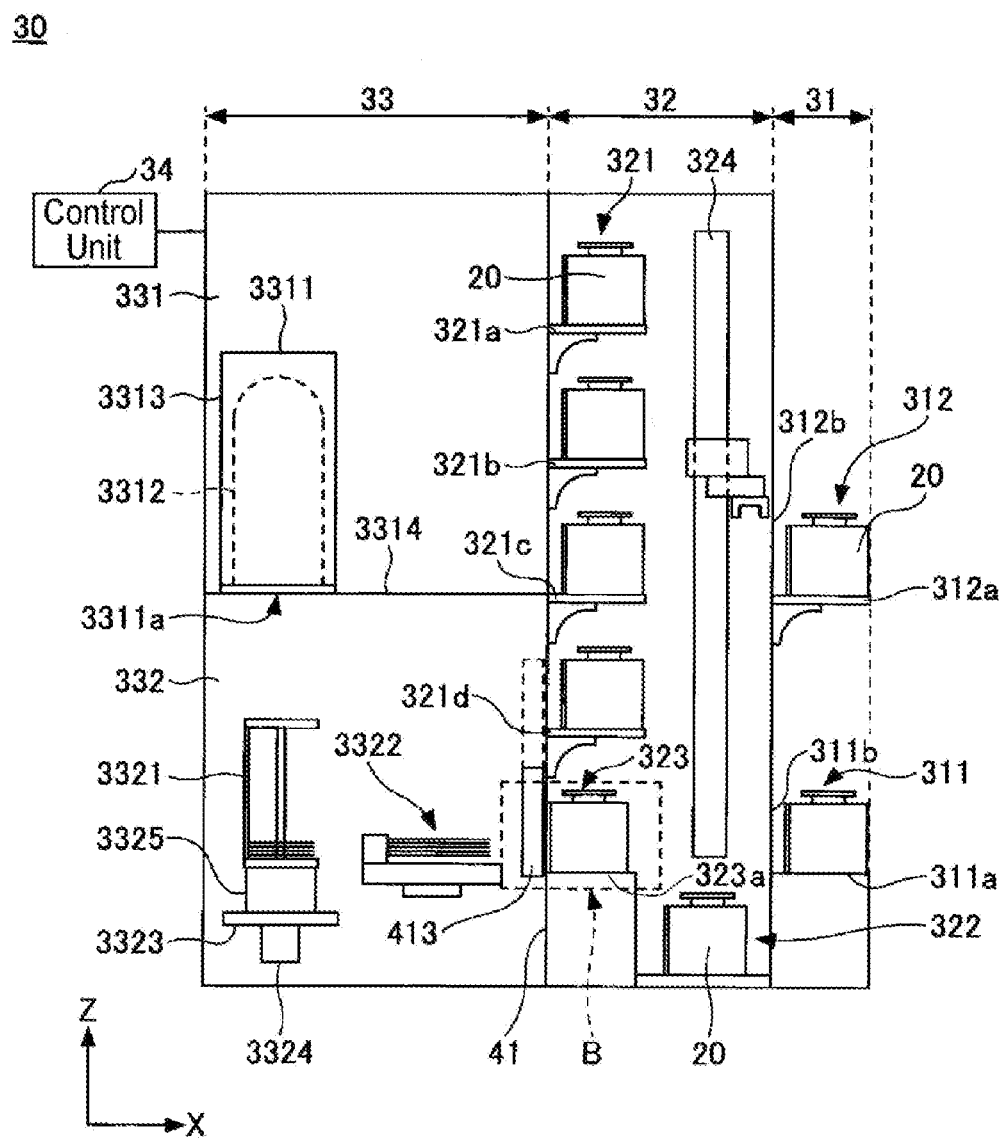
FIG. 3 is a schematic explanatory view illustrating a vertical heat treatment apparatus according to an exemplary embodiment of the present disclosure.

FIG. 3 illustrates a schematic cross-sectional view of a vertical heat treatment apparatus 30 according to an exemplary embodiment.

As illustrated in FIG. 3, the vertical heat treatment apparatus 30 of the present exemplary embodiment may include, for example, a carry-in/out unit 31, a carrying and storing unit 32, and a heat treatment unit 33 which are arranged side by side in the horizontal direction (X-axis direction) in the drawing. Each unit will be described below.

(Carry-In/Out Unit)

The carry-in/out unit 31 may be disposed adjacent to the carrying and storing unit 32 and may carry carrying containers 20, each accommodating a plurality of wafers, into/out of the vertical heat treatment apparatus 30.

Although the configuration of the carry-in/out unit 31 is not particularly limited, for example, two stages of load ports of a lower load port 311 and an upper load port 312 may be disposed, as illustrated in FIG. 3. Each load port may include a table on which a carrying container 20 is placed and an opening through which the carrying container 20 is carried into/out of the carrying and storing unit 32. Meanwhile, each of the carrying containers 20, which is supplied to one of the load ports, may accommodate a plurality of processing target objects, for example, a plurality of wafers.

Specifically, the lower load port 311 may include a first carry-in/out table 311a on which the carrying container 20 is placed, and a first opening 311b.

The upper load port 312 may include a second carry-in/out table 312a on which a carrying container 20 is placed, and a second opening 312b. Further, both the first carry-in/out table 311a and the second carry-in/out table 312a may be configured such that two carrying containers 20 are placed in a direction perpendicular to the sheet of the drawing.

The carrying containers 20 carried to the first carry-in/out table 311a and the second carry-in/out table 312a may be carried to a first storing section 321 or a second storing section 322 in the carrying and storing unit 32, or a placing table 323a of a transfer section 323 by a conveying mechanism 324 of the carrying and storing unit 32, which will be described below. Further, a carrying container 20 that accommodates wafers processed in the heat treatment unit 33 may be carried out to the first carry-in/out table 311a or the second carry-in/out table 312a.

Meanwhile, the first carry-in/out table 311a or the second carry-in/out table 312a may be used as a storing section (a third storing section) to temporally store a carrying container 20 according a carrying-in/out situation of the carrying containers 20.

(Carrying and Storing Unit)

The carrying and storing unit 32 may include a first storing section (a first carrier stage) 321 configured to store a plurality of carrying containers 20. Further, if necessary, a second storing section (a second carrier stage) 322 configured to store a plurality of carrying containers 20 may be provided.

The carrying and storing unit 32 may include a placing table 323a of the transfer section 323 on which a carrying container 20 is placed when the wafers in the carrying container 20 are transferred to a holder 3321 of the heat treatment unit 33 to be described below. Further, the heat treatment apparatus may further include a conveying mechanism 324 configured convey the carrying containers 20 among the first storing section 321, the second storing section 322, the placing table 323a of the transfer section 323, and the carry-in/out unit 31.

The first storing section 321 and the second storing section 322 are members on which the carrying container 20 are placed and stored. By providing the storing sections on which the carrying containers 20 are placed in the vertical heat treatment apparatus 30, the wafers within a heat treatment furnace 3311 (described below) may be quickly replaced whenever a processing on the wafers is completed in the heat treatment furnace 3311, thereby increasing the throughput of the vertical heat treatment apparatus 30.

As illustrated in FIG. 3, the first storing section 321 includes multiple tiers of placing shelves 321a to 321d and two carrying containers 20 may be placed on each placing shelf in a direction perpendicular to the sheet of the drawing. The number of tiers of the placing shelves is not particularly limited and may be arbitrarily determined depending on the height of the vertical heat treatment apparatus 30. The first storing section 321 may be provided on one selected wall of the carrying and storing unit 32. For example, the first storing section 321 may be disposed on a wall of the carrying and storing unit 32 which is opposite to the heat treatment unit 33.

As illustrated in FIG. 3, the second storing section 322 may be provided below the conveying mechanism 324. In the meantime, "below" in the exemplary embodiment means a lower side in view of a vertical direction (Z-axis direction in FIG. 3) regardless of a position in a horizontal direction (X-axis direction in FIG. 3 or a direction perpendicular to the sheet of the drawing). However, the second storing section 322 may be disposed to be at least partially overlapped with the conveying mechanism 324 when the lower side, i.e., the second storing section 323 side is viewed from the from the conveying mechanism 324 side. In particular, the second storing section 322 may be disposed just below the conveying mechanism 324.

When a carrying container 20 is disposed in the second storing section 322, the height of an upper end of the carrying container 20 may be the same as or lower than the height of the placing table 323a of the transfer section 323. However, the height of the placing table of the second storing section 322 may be determined in consideration of a movable region of the conveying mechanism 324 so as to hold the carrying container 20 by the conveying mechanism 324.

Similarly to the first storing section 321, two carrying containers 20 may be disposed in the second storing section 322 side by side in the direction perpendicular to the sheet of FIG. 3.

The transfer section 323 is also referred to as an FIMS port and may include a placing table 323a on which a carrying container 20 is placed. The carrying container 20 may be placed on the placing table 323a of the transfer section 323 when the wafers in the carrying container 20 are transferred to a holder 3321 which supplies a plurality of wafers to the heat treatment furnace 3311 (described below) or the wafers are transferred into the carrying container 20 from the holder 3321.

The placing table 323a of the transfer section 323 may be configured such that two carrying containers 20 may be placed thereon in the direction perpendicular to the sheet of the drawing. In this case, for example, an opening 411 (described below), a sealing member 412 (see, e.g., FIG. 4), a door 413, and a cover opening/closing mechanism may be disposed to correspond to the placing position of the carrying container 20 placed on the placing table 323a of the transfer section 323.

FIG. 3 illustrates an example in which the placing table 323a of the transfer section 323 is disposed below the first storing section 321, the installation position of the transfer section 323 is not limited to the present exemplary embodiment. For example, among the placing shelves of the first storing section 321, the placing shelf 321d may be used as the placing table of the transfer section 323 and the shelf illustrated as the placing table 323a of the transfer section 323 in FIG. 3 may be used as one of the placing shelves of the first storing section 321. That is, the positions of the placing shelf 321d of the first storing section 321 and the placing table 323a of the transfer section 323 may be switched.

The number of carrying containers 20 which may be placed in the transfer section 323 is not limited to two, but may be arbitrarily changed. For example, when it is necessary to place two or more carrying containers 20 in the transfer section 323, the lowermost placing shelf 321d of the first storing section 321 may serve as the placing table 323a of the transfer section 323. In this case, an opening 411, a sealing member 412 (see, e.g., FIG. 4), a door 413 (described below), or a cover opening/closing mechanism may be provided to correspond to a carrying container 20 mounted on the placing shelf 321d.

The transfer section 323 may also be used as a storing section (a fourth storing section) which temporally stores a carrying container 20 according to a transferring situation of wafers between the holder 3321 and a carrying container 20. Details of the configuration of the transfer section 323 will be described below.

The conveying mechanism 324 conveys carrying containers 20.

The conveying mechanism 324 may convey carrying containers 20 between the carrying and storing unit 32 and the outside of the carrying and storing unit 32. In particular, the conveying mechanism 324 may convey the carrying containers 20 carried in from the carry-in/out unit 31, to the first storing section 321, the second storing section 322, and the placing table 323a of the transfer section 323. Further, the conveying mechanism 324 may carry out the carrying container 20 that accommodates wafers, on which the treatment has been completed in the heat treatment unit 33, to the carry-in/out unit 31.

The conveying mechanism 324 may convey the carrying containers 20 within the carrying and storing unit 32. Specifically, the conveying mechanism 324 may convey the carrying containers 20 among the first storing section 321, the second storing section 322, and the placing table 323a of the transfer section 323.

The detailed configuration of the conveying mechanism 324 is not particularly limited as long as the conveying mechanism may convey the carrying container 20. For example, the conveying mechanism 324 may employ a mechanism configured to hold a carrying container 20 from the top side thereof and convey the carrying container 20. As for the conveying mechanism capable of holding the carrying container 20 from the top side thereof and conveying the carrying container 20, an automation flange may be appropriately used.

(Heat Treatment Unit)

As described above, the heat treatment unit 33 may have a heat treatment furnace 3311 which accommodates a holder 3321 configured to hold a plurality of wafers in multiple tiers and perform a heat treatment on the wafers.

The heat treatment unit 33 may include a heat treatment furnace area 331 in which the heat treatment furnace 3311 is disposed, and a transfer area 332 (loading area) in which wafers are transferred between the carrying container 20 and the holder 3321. In the transfer area 332, when the wafers are supplied to the heat treatment furnace 3311 or when the wafers, on which the treatment has been performed in the heat treatment furnace 3311, are carried out, the wafers may be transferred between the carrying container 20 and the holder 3321.

The heat treatment furnace area 331 may be disposed in the transfer area 332 as illustrated in FIG. 3 and the heat treatment furnace 3311 is disposed in the heat treatment furnace area 331. The heat treatment furnace 3311 may include a reaction tube 3312 which is an elongated processing container whose lower portion is opened as a furnace inlet 3311a and a heater 3313 disposed to cover the circumference of the reaction tube 3312. Although a configuration of the heater 3313 is not particularly limited, the heater 3313 may heat the inside of the reaction tube 3312, for example, to 300° C. to 1200° C.

The reaction tube 3312 may be formed of silica, and a plurality of gas introduction tubes, which introduces a processing gas or a purge inert gas into the reaction tube 3312 or an exhaust tube including, for example, a vacuum pump or a pressure control valve to control the inside of the reaction tube, may be connected thereto. Further, the furnace inlet 3311a may be formed in the bottom side of the reaction tube so as to introduce the wafers.

The reaction tube 3312 or the heater 3313 may be disposed on a base plate 3314 and an opening is formed in the base plate 3314, so that carry-in/out of the holder 3321 holding the wafers may be performed with respect to the lower side in the drawing. The base plate 3314 may be made of, for example, stainless steel.

The transfer area 332 may be provided with, for example, the holder 3321 configured to transfer the wafer in the carrying container 20 placed on the placing table 323a of the transfer section 323 of the carrying and storing unit 32.

Specifically, for example, as illustrated in FIG. 3, a transfer mechanism 3322 configured to transfer wafers between the carrying container 20 placed on the placing table 323a of the transfer section 323 and the holder 3321 may be disposed. Meanwhile, the transfer mechanism 3322 may transfer the wafers from the carrying container 20 to the holder 3321 so as to supply the wafers to the heat treatment furnace 3311. After heat treatment, the transfer mechanism 3322 may transfer the wafers, on which the heat treatment has been finished, from the holder 3321 to the carrying container 20.

The holder 3321 is also referred to as a boat and may hold a plurality of wafers, like a shelf. The holder 3321 is disposed on a cover body 3323 with a heat insulating unit (a heat insulating box) 3325 interposed therebetween.

The cover body 3323 is supported on an elevating mechanism (not illustrated) and lifted by the elevating mechanism to seal the furnace inlet 3311*a* of the heat treatment furnace 3311. Further, the holder 3321 disposed on the cover body 3323 may be carried into/carried out of the heat treatment furnace 3311 by the elevating mechanism.

In addition, a rotating mechanism 3324 may be provided so as to rotate the wafers held in the holder 3321 disposed on the cover body 3323 in a horizontal plane within the heat treatment furnace 3311.

A shutter (not illustrated) may be disposed in the transfer area 332 so as to close the furnace inlet 3311*a* when the holder 3321 or the cover body 3323 is lowered.

Respective units included in the vertical heat treatment apparatus 30 of the exemplary embodiment have been described above.

In the vertical heat treatment apparatus 30, a region, to which the carrying container 29 is carried in from the outside of the vertical heat treatment apparatus 30 to be stored, may be used as a carry-in area. Therefore, among the units described above, the carry-in/out unit 31 and the carrying and storing unit 32 may be used as the carry-in areas.

(Configuration of Transfer Section and Periphery of Transfer Section)

Figure 6:
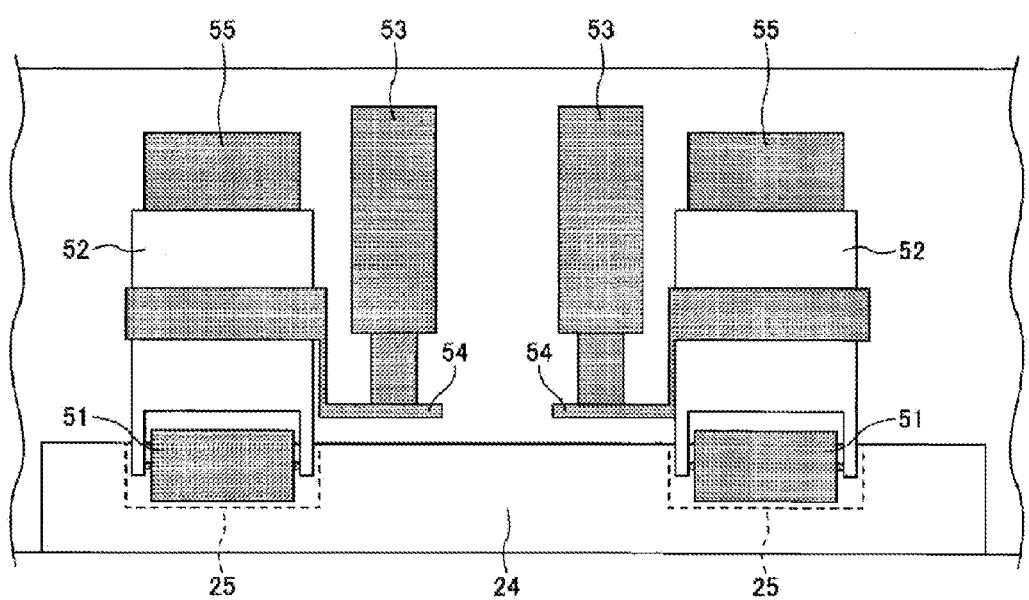
FIG. 6 is a schematic explanatory view illustrating a carrying container holding unit according to an exemplary embodiment of the present disclosure.

Next, an exemplary configuration of the transfer section described above and a periphery thereof will be described with reference to FIGS. 4 to 6.

Figure 4:
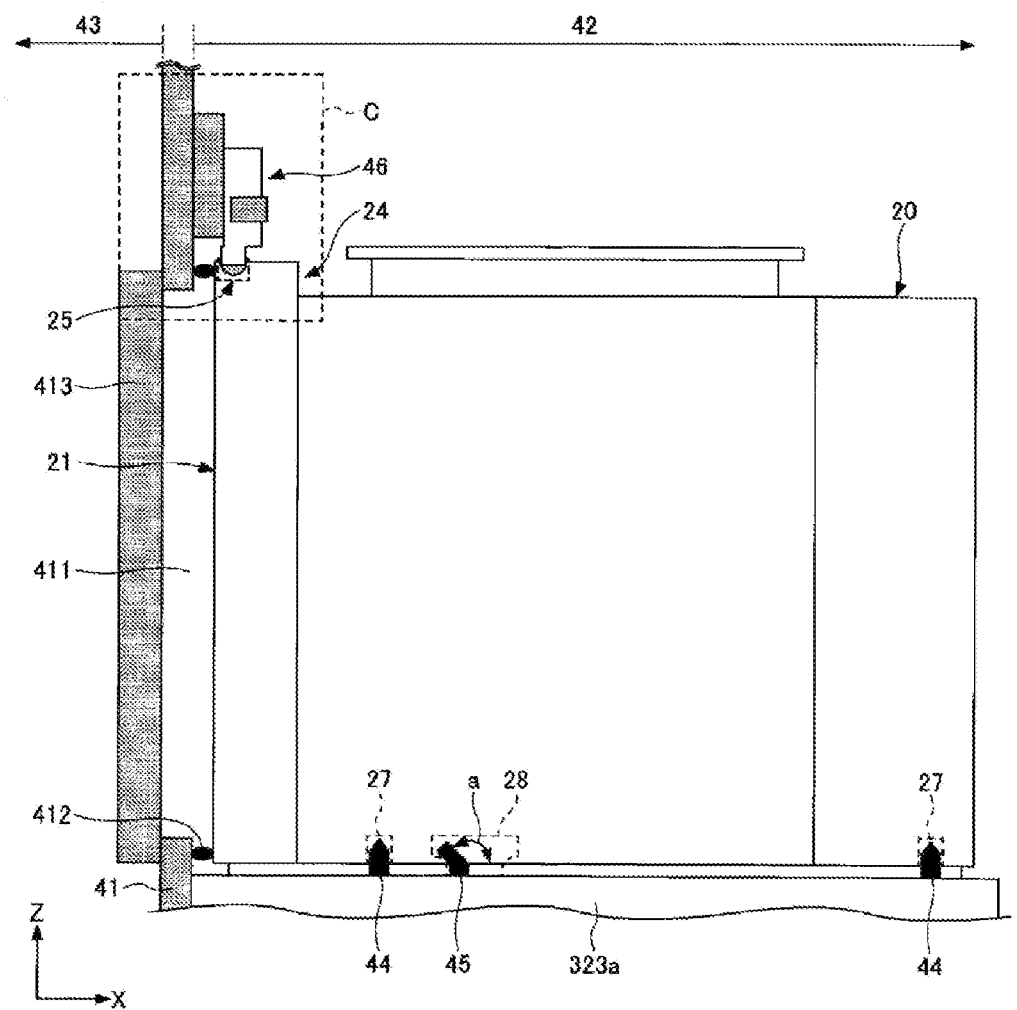
FIG. 4 is a view illustrating a part enclosed by dotted line B in FIG. 3 in an enlarged scale.

FIG. 4 is a view illustrating a region enclosed by dotted line B in FIG. 3 in an enlarged scale in a state where a carrying container 20 abuts against the partition wall 41 after the carrying container 20 is placed on the placing table 323*a* of the transfer section 323. FIGS. 5A and 5B are views illustrating a region enclosed by dotted line C in FIG. 4 in a more enlarged scale, in which FIG. 5A illustrates the region in a state where a carrying container holding unit 46 is inserted into a recess 25 and FIG. 5B illustrates the region in a state where the carrying container holding unit 46 is not inserted into the recess 25. FIG. 6 illustrates a cross-sectional view taken along line D-D' of FIG. 5A.

Referring to FIG. 4, the partition wall 41 is provided between the carrying and storing unit 32 illustrated in FIG. 3 and the heat treatment unit 33. Therefore, rather than the partition wall 41, the carrying and storing unit 32 becomes the carry-in area 42 and the heat treatment unit 33 becomes the transfer area 43. The transfer area 43 referred to herein means the same region as the above-described transfer area 332 of the heat treatment unit 33.

The transfer area 43 is maintained, for example, under an inert gas atmosphere or a clean dry air atmosphere, and the pressure of the transfer area 43 is set to be higher than that of the carry-in area 42 so that the atmosphere of the carry-in area does not infiltrate into the transfer area 43. Meanwhile, the atmosphere of the transfer area 43 is not particularly limited and may be arbitrarily selected depending on, for example, the contents of a process to be performed. For example, the transfer area may be under a nitrogen gas atmosphere. Further, the transfer area may be under a clean dry gas atmosphere, specifically, under an air atmosphere which contains less particles or organic components and has a dew point of −60° C. or lower.

It is not necessary to particularly control the atmosphere of the carry-in area 42. The carry-in area 42 may be under the same atmosphere as an environment where the vertical heat treatment apparatus 30 is provided, for example, the ambient atmosphere.

The partition wall 41 may be formed with an opening 411 to allow the carry-in area 42 and the transfer area 43 to communicate with each other. The opening 411 is formed to convey wafers between a carrying container 20 placed on the placing table 323*a* of the transfer section 323 and the transfer area 43. Therefore, the opening 411 may be formed at a position corresponding to the take-out opening 21 of the carrying container 20 when the carrying container 20 is placed on the placing table 323*a* of the transfer section 323 and the carrying container 20 abuts against the partition wall 41.

A sealing member 412 may be provided on the partition wall 41 of the carry-in area 42 side to surround the opening 411. The sealing member 412 is provided to seal a gap between the partition wall 41 and the carrying container 20 when the carrying container 20 abuts against with the partition wall 41, which will be described below. The drawing illustrates a member having an approximately circular cross-section as the sealing member 412. However, the sealing member 412 is not limited to this shape and may have any shape as long as the sealing member may be configured to seal the gap between the partition wall 41 and the carrying container 20 in a place where the partition wall 41 abuts against the carrying container 20.

An opening/closing door 413 which may seal the opening 411 from the transfer area 43 side or a cover opening/closing mechanism (not illustrated) which may open the cover 22 of the carrying container 20 in a state where the door 413 is closed may be provided. Further, an exhausting unit or a gas supply slot (not illustrated) may be formed so as to replace the atmosphere of a region including the opening 411 enclosed by the door 413 and the carrying container 20 after the carrying container 20 abuts against the partition wall 41. Meanwhile, the door 413 may be configured to retreat upwardly or downwardly as illustrated by the dotted line in FIG. 3 by the door opening mechanism (not illustrated) together with the cover 22 of the carrying container 20, so as not to interfere with the transfer of wafers, after the cover 22 of the carrying container 20 is opened.

Pins 44 corresponding to the positioning recesses 27 formed on the bottom part of the carrying container 20 may be provided on the placing table 323*a* so as to perform the positioning of the carrying container 20 when the carrying container 20 is placed on the placing table 323*a*. The number of pins 44 provided on the placing table 323*a* is not particularly limited and an arbitrary number of pins may be provided so as to position the carrying container 20. For example, three pins 44 may be provided on one placing table 323*a*. Meanwhile, the carrying container 20 is placed on the placing table 323*a* of the transfer section 323 such that the partition wall 41 and the side of the carrying container 20 formed with the take-out opening 21 face each other, as illustrated in FIG. 4.

In addition, locking mechanisms 45 corresponding to the engagement recesses 28 formed on the bottom part of the carrying container 20 may be provided on the placing table 323*a*. Although the configuration of the locking mechanisms 45 is not particularly limited, the locking mechanisms 45 may have a hook shape as illustrated in the drawing and may be configured to rotate in the direction indicated by bidirectional arrow a as illustrated in FIG. 4. Further, the carrying container 20 is mounted on the placing table 323a to be positioned by the pins 44, and then the locking mechanisms 45 rotate to be engaged with the engagement recesses 28. The number of locking mechanisms 45 provided on the placing table 323a is not particularly limited and an arbitrary number of locking mechanisms 45 may be provided to fix the carrying container 20.

When the carrying container 20 is placed on the placing table 323a, the carrying container 20 and the partition wall 41 are spaced apart from each other. Therefore, after the carrying container 20 is placed on the placing table 323a and the locking mechanisms 45 are engaged with the engagement recesses 28 of the carrying container 20, the placing table 323a is moved toward the partition wall 41 along the X axis by a carrying container pressing unit (not illustrated). Further, as illustrated in FIG. 4, the surface of the carrying container 20 facing the partition wall 41 abuts against the partition wall 41. In this case, the surface of the carrying container 20 facing the partition wall 41 abuts against the partition wall 41 with the sealing member 412 being interposed therebetween and a region including the opening 411 enclosed by the carrying container 20 and the door 413 becomes a closed space.

As described above, since the pressure of the atmosphere of the transfer area 43 is set to be higher than that of the carry-in area 42, the atmospheric pressure of the transfer area 43 is applied to the carrying container 20 when the door 413 is opened, which will be described below. In this case, since the carrying container 20 is pressed against the bottom part by a sufficient force by the carrying container pressing unit which conveys the placing table 323a toward the partition wall 41, a gap is hardly formed. However, it is difficult to apply sufficient force to the upper portion of the carrying container 20 with the pushing force exerted by the carrying container pressing unit and when the door 413 is opened, a gap is formed in the upper portion of the carrying container 20, so that the atmosphere of the transfer area 43 may be disturbed.

Therefore, in the vertical heat treatment apparatus 30 according to the present exemplary embodiment, a carrying container holding unit 46 may be provided on a top surface of the carrying container 20 as illustrated in FIG. 4. The carrying container holding unit 46 will be described below.

As described above, the carrying container 20 is provided with a flange 24 on the side where the take-out opening 21 is formed and a recess 25 is provided on the top of the flange 24. Further, the carrying container holding unit 46 may be configured to be inserted into the recess 25 from the top side of the carrying container 20 to press the carrying container 20 against the partition wall 41.

The configuration of the carrying container holding unit 46 is not particularly limited as long as it may be inserted into the recess 25 formed on the flange 24 of the carrying container 20 from the top side of the carrying container 20 to press the carrying container 20 against the partition wall 41.

The carrying container holding unit 46 may include a roller unit 51 inserted into the recess 25 and a plate-shaped body 52 connected to the roller unit 51, as illustrated in FIGS. 5A and 5B.

The roller unit 51 moves up and down as the plate-shaped body 52 moves in the vertical direction and when the plate-shaped body 52 moves downwardly, the roller unit 51 may be inserted into the recess 25, as illustrated in FIG. 5A.

Further, when the plate-shaped body 52 moves upwardly, the roller unit 51 is removed from the recess 25 as illustrated in FIG. 5B and the force applied to the upper portion of the carrying container 20 to press the upper portion of the carrying container 20 against the partition wall 41 may be released.

When the carrying container holding unit 46 includes the roller unit 51 and the plate-shaped body 52, the sizes of the roller unit 51 and the plate-shaped body 52 are not particularly limited. However, since the roller unit 51 is inserted into the recess 25, the size of the roller unit 51 may be selected such that the roller unit 51 may be accommodated in the recess 25. For example, when the width of the recess 25 in the direction perpendicular to the partition wall 41 (X-axis direction in FIG. 5) is 20 mm, the diameter of the roller unit 51 may be 19 mm or less.

In order to move the plate-shaped body 52 and the roller unit 51 of the carrying container holding unit 46 in up and down, various members may be provided in the carrying container holding unit 46. Specifically, a displacement unit 53 may be connected to the carrying container holding unit 46. Although the displacement unit 53 may be directly connected to the plate-shaped body 52, a force transmission unit 54 may be provided between the displacement unit 53 and the plate-shaped body 52 to transmit the force from the displacement unit 53 to the plate-shaped body 52. Further, in order to smoothly move the carrying container holding unit 46 up and down when the force is applied to the plate-shaped body 52 by the displacement unit 53, a guide member 55 may be provided on the plate-shaped body 52 of the carrying container holding unit 46.

An air cylinder may be used as the above-described displacement unit 53. Further, a linear motion guide (LM guide) may be used as the guide member 55.

The configurations of the plate-shaped body 52 and the roller unit 51 of the carrying container holding unit 46 are not particularly limited. However, the plate-shaped body 52 and the roller unit 51 may be configured to press the carrying container 20 against the partition wall 41 when the carrying container holding unit 46 is inserted into the recess 25 of the carrying container 20 as described above.

The plate-shaped body 52 of the carrying container holding unit 46 may be partially or wholly formed of an elastic body. That is, the carrying container holding unit 46 may include the roller unit 51 and the plate-shaped body 52 connected to the roller unit 51 in which the plate-shaped body 52 may be configured to include an elastic body. As the elastic body included in the plate-shaped body 52, for example, a leaf spring may be used. As described above, when the plate-shaped body 52 includes an elastic body, the carrying container 20 may be pressed against the partition wall 41 by the elastic force generated when the plate-shaped body 52 is deformed by inserting the carrying container holding unit 46 into the recess 25. In this case, although the configuration of the roller unit 51 is not particularly limited, the roller unit may be configured by a rigid body.

The carrying container holding unit 46 may be configured such that the roller unit 51 includes an elastic body. That is, the carrying container holding unit 46 may include the roller unit 51 and the plate-shaped body 52 connected to the roller unit 51, in which the roller unit 51 may be configured to have an elastic body. The roller unit 51 may be configured by the elastic body, except for a shaft (a rotary shaft) part of the roller unit 51. Although the elastic body included in the roller unit 51 is not particularly limited, a rubber may preferably be used as the elastic body, and a fluorinated rubber may be more preferably used as the elastic body. As described above, when the roller unit 51 includes an elastic body, the roller unit 51 is inserted into the recess 25 and the carrying container 20 may be pressed against the partition wall 41 by the reactive force generated when the elastic body is contracted.

When the roller unit 51 includes an elastic body, the configuration of the plate-shaped body 52 is not particularly limited and may have an arbitrary configuration. For example, the plate-shaped body 52 may be configured by a rigid body. Further, the plate-shaped body 52 may be configured to include the elastic body as described above.

As described above, when the roller unit 51 and/or the plate-shaped body 52 of the carrying container holding unit 46 include the elastic body and the carrying container holding unit 46 is inserted into the recess 25 of the carrying container 20, the positions of the carrying container holding unit 46 and the recess 25 may be adjusted to allow the carrying container holding unit 46 to press the carrying container 20 against the partition wall 41.

For example, as illustrated in FIG. 5B, a distance L1 between the roller unit 51 and the partition wall 41 before the carrying container holding unit 46 is inserted into the recess 25 may be shorter than a distance L2 between a wall 251 of the recess 25 positioned at the partition wall 41 side among walls of the recess 25 and the partition wall 41. That is, before the carrying container 20 abuts against the partition wall 41 by the carrying container pressing unit and the carrying container holding unit 46 is inserted into the recess 25, the roller unit 51 may be located closer to the partition wall 41 than to a position just above the recess 25.

Meanwhile, as illustrated in FIG. 5B, the above-described distance L1 indicates a distance between the roller unit 51 and the partition wall 41 when the roller unit 51 is positioned closest to the partition wall 41. Further, the distance L2 indicates a distance between the wall 251 of the recess 25 positioned at the partition wall 41 side among the walls of the recess 25 and the partition wall 41 when the carrying container 20 abuts against the partition wall 41 by the carrying container pressing unit.

By configuring the distance L1 and the distance L2 as described above, when the carrying container holding unit 46 is inserted into the recess 25, a part of the roller unit 51 comes in contact with the flange 24 to be seated on the flange 24, and inserted into the recess 25. When the carrying container holding unit 46 is inserted into the recess 25, the carrying container holding unit 46 is pressed by the wall 251 of the recess 25 positioned at the partition wall 41 side among the walls of the recess 25, so that force is applied in the X-axis direction in FIGS. 5A and 5B. Therefore, when the plate-shaped body 52 and/or the roller unit 51 of the carrying container holding unit 46 include the elastic body, the plate-shaped body 52 and/or the roller unit 51 are partially deformed. For example, the carrying container 20 may be pressed against the partition wall 41 by the elastic force of the plate-shaped body 52 when the plate-shaped body 52 includes an elastic body, and by the reactive force of the elastic body of the roller unit 51 when the roller unit 51 includes an elastic body.

The distance L which is a difference between the distance L1 and the distance L2 is not particularly limited and may be arbitrarily selected based on a variation applied to the carrying container holding unit 46 when the carrying container holding unit 46 is inserted into the recess 25. However, the distance L may be 0.5 mm or larger. The upper limit of the distance L is not specifically limited. However, when the distance L is too long, a strong force is required when the carrying container holding unit 46 is inserted into the recess 25. Thus, the distance L may be, for example, 3 mm or less.

An arrangement of the carrying container holding unit 46 is not limited to the configuration described above. For example, when the carrying container holding unit 46 is inserted into the recess 25, the carrying container holding unit 46 may be obliquely inserted with respect to the wall 251 closest to the partition wall 41 among the walls of the recess 25. That is, when the carrying container holding unit 46 is inserted into the recess 25, the carrying container holding unit 46 may be inserted such that an insertion direction of the carrying container holding unit 46 is oblique with respect to the wall 251 closest to the partition wall 41 among the walls of the recess 25. Specifically, the angle between the wall 251 closest to the partition wall 41 among the walls of the recess 25 and an insertion direction of the carrying container holding unit 46 may be an acute angle. By inserting the carrying container holding unit 46 into the recess 25 such that the carrying container holding unit 46 is inclined with respect to the wall 251 of the recess 25 closest to the partition wall 41, the force of pressing the wall 251 against the partition wall 41 may be further applied.

The method of inserting the carrying container holding unit 46 to be inclined with respect to the wall 251 is not specifically limited. For example, a method of disposes the guide member 55 to be oblique to the partition wall 41 may be considered. Referring to FIGS. 5A and 5B, since the partition wall 41 and the guide member 55 are disposed in parallel to each other, the carrying container holding unit 46 is moved in parallel to the wall 251 closest to the partition wall 41 among the walls of the recess 25. Whereas, for example, when the guide member 55 is disposed obliquely with respect to the partition wall 41, the carrying container holding unit 46 is also obliquely moved. Thus, the carrying container holding unit 46 may be inserted obliquely with respect to the above-described wall 251.

When the carrying container holding unit 46 is inserted obliquely with respect to the wall 251, the plate-shaped body 52 and the roller unit 51 of the carrying container holding unit 46 may be configured by a rigid body.

When the carrying container holding unit 46 is inserted obliquely with respect to the wall 251, the roller unit 51 and/or the plate shaped body 52 of the carrying container holding unit 46 may include an elastic body, as described above. When the roller unit 51 and/or the plate-shaped body 52 include an elastic body, the carrying container 20 may be pressed against the partition wall with a more strong force, by the force of the carrying container holding unit 46 which presses the carrying container 20 against the partition wall 41 and the force of pressing the carrying container 20 against the partition wall 41 by the reactive force of the elastic body included in the carrying container holding unit 46. Therefore, it is possible to particularly suppress occurrence of a gap between the carrying container 20 and the partition wall 41.

The magnitude of the force of the carrying container holding unit 46 which presses the carrying container 20 against the partition wall 41 is not specifically limited, but may be equal to or smaller than the magnitude of the force of the carrying container pressing unit provided on the placing table 323a of the transfer section 323 which presses the carrying container 20 against the partition wall 41. This is because the carrying container holding unit 46 is provided as a supplementary means of the carrying container pressing unit which is provided on the placing table 323a of the transfer section 323 and the magnitude of the force thereof is sufficient if the carrying container holding unit 46 pushes the carrying container 20 to suppress the occurrence of the gap on the carrying container 20. Further, this is because when the force of pressing the carrying container 20 against the partition wall 41 by the carrying container holding unit 46 is increased, the size of the carrying container holding unit 46 is increased and thus, the carrying container holding unit 46 may interfere with the other members.

Two recesses 25 may be formed on the flange 24 of the carrying container 20 as described above. Therefore, as illustrated in FIG. 6, the carrying container holding unit 46 may be provided for every recess 25. That is, two carrying container holding units 46 may be provided above the carrying container 20. When two carrying container holding units 46 are provided, the displacement unit 53 may be shared by the two carrying container holding units 46 so that the two carrying container holding units 46 may be simultaneously moved by one displacement unit 53. However, as illustrated in FIG. 6, two displacement units 53 may be provided and the displacement units 53, the plate-shaped bodes 52, and the roller units 51 may be connected to each other by the force transmission units 54 in one to one relation. As described above, when the diameter of wafers is large, for example, when the diameter wafers is 450 mm, the size of the carrying container 20 is increased so that a gap may easily occur between the carrying container 20 and the partition wall 41. Therefore, by providing two displacement units 53 and connecting the displacement units 53, the plate-shaped bodies 52, and the roller units 51 to each other by the force transmission units 54 by one to one relation, the carrying container 20 is pushed by sufficient force by the plate-shaped bodies 52 and the roller units 51 to suppress occurrence of a gap between the carrying container 20 and the partition wall 41.

As described till now, by providing the carrying container holding unit 46 above the carrying container 20, it is possible to efficiently and more reliably suppress occurrence of a gap between the partition wall 41 and the carrying container 20 disposed on the placing table 323a of the carry-in area 42. In addition, the carrying container holding unit 46 applies a force to the carrying container 20 which merely causes the carrying container holding unit 46 to be inserted into the recess 25 formed on the flange 24 of the carrying container 20. Therefore, it is possible to suppress occurrence of a gap between the carrying container 20 and the partition wall 41 without substantial deformation of the carrying container 20.

On the placing table 323a of the transfer section 323 of FIG. 3, two carrying containers 20 may be disposed in the direction perpendicular to the sheet of the drawing. Therefore, when a member which presses the carrying container 20 against the partition wall 41 is provided at a side of the carrying container 20, it is necessary to cause the two carrying containers 20 to be sufficiently spaced apart from each other. In order to increase the interval between the two carrying containers 20, it is necessary to increase the width of the placing table 323a. As a result, there is a problem in that the footprint of the vertical heat treatment apparatus 30 is also increased. Whereas, the carrying container holding unit 46 provided in the vertical heat treatment apparatus 30 of the present exemplary embodiment is capable of being disposed above the carrying container 20. Thus, the increase of the footprint of the vertical heat treatment apparatus 30 may be prevented without substantial effect on the distance between two placing tables 323a.

Since the front end of the carrying container holding unit 46 is inserted into the recess 25, the carrying container holding unit 46 is hardly separated from the recess 25 of the carrying container 20 even when a force is applied to the carrying container 20. Therefore, it is possible to more reliably prevent occurrence of a gap between the carrying container 20 and the partition wall 41.

Although the configuration of the vertical heat treatment apparatus 30 of the present exemplary embodiment has been described until now, arbitrary components may be added to the vertical heat treatment apparatus 30 of the present exemplary embodiment, besides each of the units described above. For example, as illustrated in FIG. 3, a control unit 34 including a computer may be provided. The control unit 34 may be provided with, for example, a program, a memory, and a data processing unit including a CPU. In the program, commands (respective steps) which cause the control unit to send a control signal to each unit of the vertical heat treatment apparatus 30 so as to perform respective processing processes such as, for example, conveyance of a carrying container 20, operation of a carrying container holding unit 46, opening of the door 413 of the partition wall 41, transfer of a wafer between the carrying container 20 and the holder 3321, and heat treatment in the heat treatment furnace 3311 may be configured. The program may be stored in a storage medium such as, for example, a computer storing medium, for example, a flexible disk, a compact disk, a hard disk, a magneto-optic (MO) disk, or a memory card and installed in the control unit.

According to the substrate processing apparatus of the present disclosure described above, it is possible to suppress occurrence of a gap between a partition wall provided between a carry-in area and a transfer area and a carrying container placed on a placing table in the carry-in area when processing target objects loaded/unloaded between the transfer area and the carrying container mounted on the placing table of the carry-in area.

(Substrate Processing Method)

Next, an exemplary configuration of a substrate processing method according to an exemplary embodiment will be described. Meanwhile, although the present exemplary embodiment will be described with reference to a substrate processing method which uses a vertical heat treatment apparatus as an example, the present disclosure is not limited to the exemplary embodiment.

A substrate processing method of the present exemplary embodiment relates to a method of a method for processing a plurality of substrates using a substrate processing apparatus. The substrate processing apparatus includes: a carry-in area where a placing table is provided to place thereon a carrying container configured to accommodate a plurality of processing target objects, in which the carrying container includes a take-out opening configured to load/unload the processing target objects therethrough, a flange formed on an upper portion of a side of a surface formed with the take-out opening, and a recess formed on a top surface of the flange; a transfer area maintained under an atmosphere different from that of the carry-in area; a partition wall configured to partition the carry-in area and the transfer area and formed with an opening; and a door configured to open/close the opening. The carrying container placed on the placing table is pressed against the partition wall so that the take-out opening of the carrying container faces the opening of the partition wall, and the door is opened to convey the processing target objects within the carrying container to the transfer area and to process the processing target objects. When the carrying container is pressed against the partition wall, the carrying container holding unit may be inserted into the recess from an upper side of the carrying container to press the carrying container against the partition wall.

The substrate processing method of the present exemplary embodiment may be performed in the vertical heat treatment apparatus 30 which includes a carry-in area 42, a transfer area 43, and a partition wall 41 which partitions the carry-in area 42 and the transfer area 43 as illustrated in FIGS. 3 and 4. Therefore, the substrate processing apparatus may have the same configuration as the substrate processing apparatus described above, except for the features described below. Thus, the descriptions on the substrate processing apparatus will be omitted.

The transfer area 43 of the vertical heat treatment apparatus 30 is maintained under an inert gas atmosphere or a clean dry air atmosphere and the pressure of the transfer area 43 is set to be higher than that of the carry-in area 42 so that the atmosphere of the carry-in area 42 does not infiltrate into the transfer area 43. It is not necessary to particularly control the atmosphere of the carry-in area 42. The carry-in area 42 may be under the same atmosphere as an environment where the vertical heat treatment apparatus 30 is provided, for example, under the ambient atmosphere.

In the substrate processing method of the exemplary embodiment, a placing step of placing a carrying container 20 on a placing table 323a may be performed such that the take-out opening 21 of the carrying container 20 on the placing table 323a provided in the carry-in area 42 faces the opening 411 of the partition wall 41.

The placing step may be performed by conveying and placing the carrying container 20 placed on a first carry-in/out table 311a or a second carry-in/out table 312a of the carry-in/out unit 31 or in the first storing section 321 or the second storing section 322 of the carrying and storing unit 32 by the conveying mechanism 324. When the carrying container 20 is placed on the placing table 323a, the positioning of the carrying container 20 may be performed by the pins 44 provided on the placing table 323a and the positioning recesses 27 formed on the bottom part of the carrying container 20. Further, after the carrying container 20 is placed on the placing table 323a, the locking mechanism 45 provided on the placing table 323a may be engaged with the engagement recess 28 formed on the bottom part of the carrying container 20 to fix the carrying container 20 to the placing table 323a.

Next, a carrying container pressing step of pressing the carrying container 20 against the partition wall may be performed. The carrying container pressing step may be performed by moving the placing table 323a toward the partition wall 41 by the carrying container pressing unit provided on the placing table 323a. In this case, the surface of the carrying container 20 which faces the partition wall 41 abuts against the partition wall 41 with the sealing member 412 being interposed therebetween and a region including the opening 411 enclosed by the carrying container 20 and the door 413 becomes a closed space.

In the carrying container pressing step, when the carrying container 20 is pressed against the partition wall 41 by the carrying container pressing unit, the carrying container holding unit 46 is inserted into the recess 25 from the upper side of the carrying container 20 to press the carrying container 20 against the partition wall 41.

Since the carrying container holding unit 46 has been described above, the descriptions thereof will be omitted.

The carrying container holding unit 46 is inserted into the recess 25 so as to more reliably suppress occurrence of a gap between the partition wall 41 and the carrying container 20 mounted on the placing table 323a of the carry-in area 42 when the processing target objects are loaded/unloaded between the transfer area 43 and the carrying container 20 placed on the placing table 323a of the carry-in area 42.

Next, a gas replacing step of replacing a gas is performed in a region where the opening 411 enclosed by the carrying container 20 and the door 413 is included so that the region has the same atmosphere as the transfer area 43.

After the gas replacing step, a cover opening step of opening the cover 22 of the carrying container 20 by a cover opening mechanism or a door opening step of opening the door 413 provided in the opening 411 by a door opening mechanism (not illustrated) may be performed.

By performing the above-described steps, the inner space of the carrying container 20 and the transfer area 43 are directly connected with each other. Therefore, wafers as processing target objects in the carrying container 20 are transferred to the holder 3321 by the transfer mechanism 3322 and introduced the heat treatment furnace 3311 so as to perform the heat treatment on the wafer. Further, the wafers, on which the treatment has been completed by the heat treatment furnace 3311, may be transferred from the holder 3321 to the carrying container 20, by the transfer mechanism 3322.

According to the substrate processing method of the present exemplary embodiment described above, it is possible to suppress occurrence of a gap between a partition wall provided between a carry-in area and a transfer area and a carrying container mounted on a placing table in the carry-in area when processing target objects are loaded/unloaded between the transfer area and the carrying container placed on the placing table of the carry-in area.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing apparatus, comprising:
a carry-in area including a placing table for placing thereon a carrying container configured to accommodate a plurality of processing target objects, the carrying container including a take-out opening configured to load/unload the processing target objects therethrough, a flange formed on at least an upper portion of a side of a surface formed with the take-out opening, and a recess formed on a surface of the flange;
a transfer area maintained under an atmosphere different from that of the carry-in area;
a partition wall configured to partition the carry-in area and the transfer area, the partition wall including an opening;
a door configured to open/close the opening; and
a carrying container holding unit configured, when the carrying container is placed on the placing table with opening of the carrying container facing the opening of the partition wall, to be inserted into the recess from an upper side of the carrying container to press the carrying container against the partition wall.

2. The apparatus of claim 1, wherein the carrying container holding unit includes a roller unit and a plate-shaped body connected to the roller unit.

3. The apparatus of claim 2, wherein the plate-shaped body is partially or wholly formed of an elastic member.

4. The apparatus of claim 3, wherein a difference between the distance between the roller unit and the partition wall before the carrying container holding unit is inserted into the recess and the distance between the wall of the recess on a side of the partition wall and the partition wall is equal to or larger than 0.5 millimeters and equal to or smaller than 3 millimeters.

5. The apparatus of claim 2, wherein the roller unit is partially or wholly formed of an elastic member.

6. The apparatus of claim 2, wherein a distance between the roller unit and the partition wall before the carrying container holding unit is inserted into the recess is shorter than a distance between a wall of the recess on a side of the partition wall and the partition wall.

7. The apparatus of claim 1, wherein, when the carrying container holding unit is inserted into the recess, the carrying container holding unit is inserted obliquely with respect to a wall of the recess closest to the partition wall among walls of the recess.

8. The apparatus of claim 1, wherein a magnitude of a force applied by the carrying container holding unit to press the carrying container against the partition wall is equal to or smaller than a magnitude of a force applied by the carrying container pressing unit to press the carrying container against the partition wall.

* * * * *